United States Patent [19]
Miyabe et al.

[11] Patent Number: 5,523,712
[45] Date of Patent: Jun. 4, 1996

[54] RESISTOR ARRAY CIRCUIT DEVICE AND VARIABLE GAIN DEVICE UTILIZING SAME

[75] Inventors: Satoru Miyabe; Akira Toyama; Minoru Takeda, all of Tokyo, Japan

[73] Assignee: Nippon Precision Circuits Inc., Tokyo, Japan

[21] Appl. No.: 399,310

[22] Filed: Mar. 6, 1995

[30] Foreign Application Priority Data

Mar. 9, 1994 [JP] Japan ..................... 6-038477

[51] Int. Cl.⁶ ................................. H03G 3/00
[52] U.S. Cl. ...................... 327/355; 327/350; 330/254
[58] Field of Search ...................... 327/349, 352, 327/355, 361, 346, 350, 553, 555, 561; 330/254, 278

[56] References Cited

U.S. PATENT DOCUMENTS

| | | | |
|---|---|---|---|
| 2,774,825 | 2/1953 | Sherr | 327/352 |
| 3,719,831 | 3/1973 | Hamburg | 327/352 |
| 4,494,212 | 1/1985 | Muellner | 330/278 |
| 4,873,490 | 10/1989 | Hecht et al. | 327/349 |
| 5,233,309 | 8/1993 | Spitalny et al. | 330/84 |
| 5,285,169 | 2/1994 | Theus | 330/254 |

FOREIGN PATENT DOCUMENTS 6461109  3/1989  Japan .

*Primary Examiner*—Timothy P. Callahan
*Assistant Examiner*—My-Trang Nu Ton
*Attorney, Agent, or Firm*—Jordan and Hamburg

[57] ABSTRACT

To provide a resistor array circuit device and variable gain device which make possible precise setting of attenuation factors and the like as well as prevention of generation of gridge noise, a resistor array circuit device has resistors $R1_1$ to $R1_{n-1}$, each with a resistance value R, resistors $R2_1$ to $R2_n$, each with a resistance value aR, resistor R3 having a resistance value $(1+b)R$, switches $SW_1$ to $SW_n$ for switching connection of resistors $R2_1$ to $R2_n$ to a terminal T3 or a terminal T4, and a control circuit for controlling switches $SW_1$ to $SW_n$ so that resistors $R2_1$ to $R2_{m-1}$ on a terminal T1 side of an arbitrary resistor $R2_m$ are connected to terminal T4 and resistors $R2_m$ to $R2_n$ on a terminal T2 side of resistor $R2_m$ are connected to terminal T3, the values of the a and b being determined based on $b=\{-1+(1+4a)^{1/2}\}/2$ and $\frac{1}{2}<a/(1+a+b)$. A variable gain device uses the above resistor array circuit device with an operational amplifier Op and a resistor R4.

11 Claims, 3 Drawing Sheets

F I G. 2
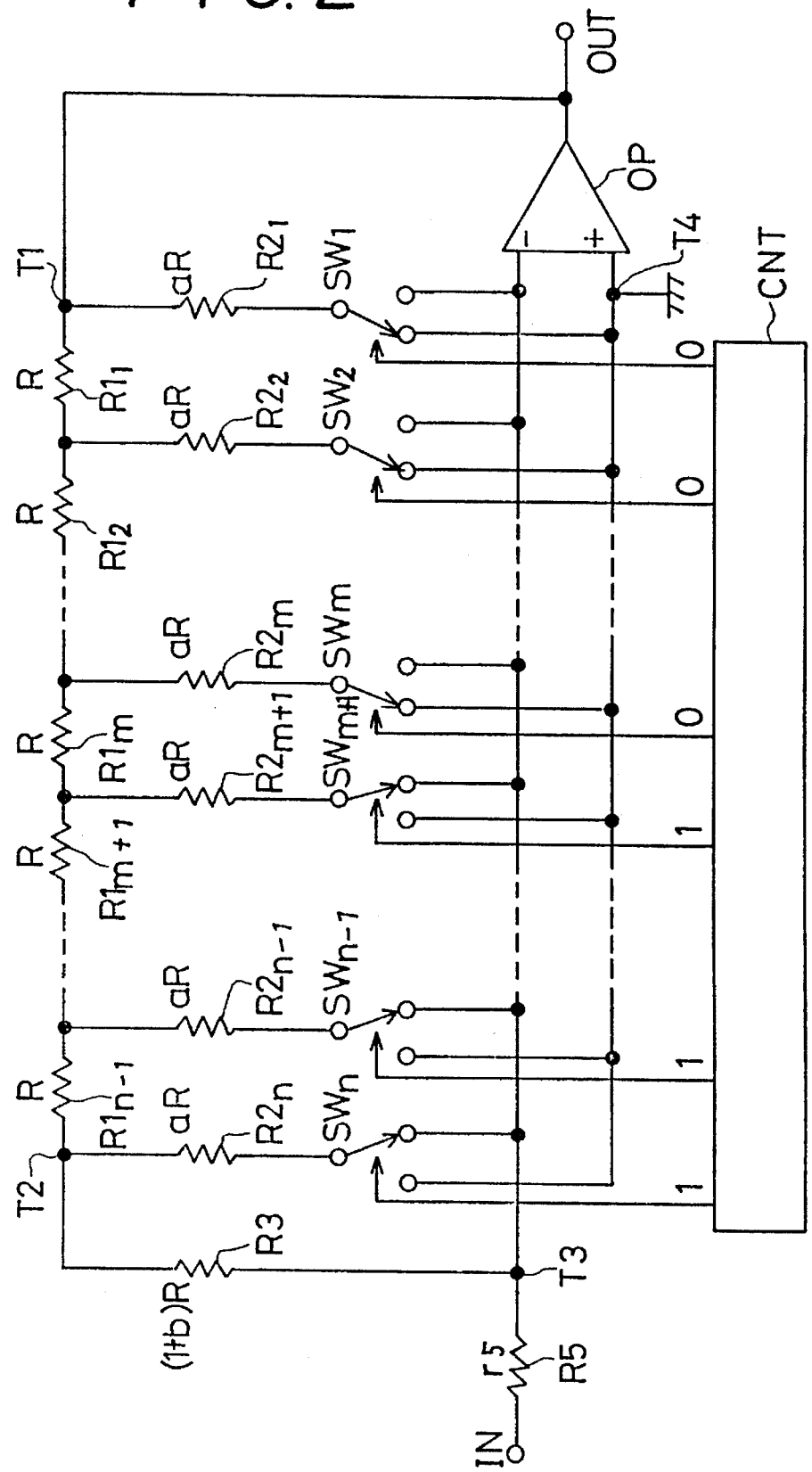

5,523,712

RESISTOR ARRAY CIRCUIT DEVICE AND VARIABLE GAIN DEVICE UTILIZING SAME

BACKGROUND OF THE INVENTION

The present invention relates to a resistor array circuit device and a variable gain device utilizing the same for audio equipment and the like.

FIG. 3 is a prior art electrical circuit diagram showing a resistor array circuit device and a variable gain device utilizing the same.

In the prior art circuit shown in FIG. 3, a resistor array circuit device is constructed by an n stage R-2R ladder resistor array, n switches SW and a control circuit CNT for controlling the states of the n switches SW. The variable gain device is constructed by this resistor array circuit device, an operational amplifier OP and a feedback resistor of the operational amplifier OP. Since the iterative impedance value of the R-2R ladder resistor array is "R" and the value of the feedback resistor is also "R", this variable gain device functions as a variable attenuator. In other words, when all of the n switches SW are connected to the inverted input terminal side of operational amplifier OP (which occurs when the control signal or digital code from control circuit CNT is "111 . . . 11"), the attenuation factor is 1. The attenuation factor or attenuation amount is changed in a stepwise manner by modifying the digital code. It is noted that the input side of the variable gain device is the MSB and the operational amplifier side is the LSB.

Japanese Laid-open Publication No. S64-61109, and specifically FIG. 4 thereof, is an example of such a prior art circuit.

In the above prior art circuit, modification of the digital code and switching of switches SW are performed simultaneously. At this time, if there are bits which are modified from "0" to "1" there are also, conversely, bits which are modified from "1" to "0". Since modification of this type of digital code is principally bidirectional, in a transitional state where the switches SW are simultaneously switched, there is a problem that spike-shaped noise, which is known as gridge noise and arises from a difference in the on speeds and off speeds of switches SW, occurs.

Also, in the above prior art circuit, precise modification of the digital codes such that stepwise modification of the attenuation factor progresses geometrically, that is, progresses arithmetically in the case of a logarithmic expression, is troublesome for the following reasons. Where the attenuation factor is within a small range, for example, the range wherein the digital code is from "111 . . . 11" to "011 . . . 11", since many digital codes within this range are selectable, relatively precise digital codes along the target geometric progression can be obtained. However, where the range of the attenuation factor is large, for example where the range of the digital code is from "00 . . . 011" to "00 . . . 001", the selectable digital codes are few, and it is difficult to obtain precise digital codes along the target geometric progression. In other words, it is difficult to precisely modify the digital codes across all ranges.

The two above-described problems do not only occur where the variable gain device shown in FIG. 3 is used as a variable attenuation device, but also where it is used as a variable amplification device.

SUMMARY OF THE INVENTION

An object of the present invention is to provide a resistor array circuit device and a variable gain device utilizing the same which prevents the generation of gridge noise and enables the precise setting of attenuation factors and the like.

In accordance with an aspect of the present invention, a resistor array circuit device includes (n−1) first resistors connected in series between a first terminal and a second terminal, each first resistor having a resistance value R; (n−2) connection points between the (n−1) first resistors; n second resistors, each having a resistance value aR and each having one end connected to one of the following: the first terminal, one of the (n−2) connection points, and the second terminal; one of the n second resistors being designated as an arbitrary second resistor which separates the n second resistors so that some of the n second resistors are on a first terminal side corresponding to the first terminal and the remaining ones of the n second resistors are on a second terminal side corresponding to the second terminal; a third terminal; a fourth terminal; a third resistor having one end connected to the second terminal, another end connected to one of the third and fourth terminals, and a resistance value (1+b)R; n switches for switching the connection of other ends of the n second resistors between the third and fourth terminals; a control circuit for controlling the n switches so that all of the n second resistors which are on the first terminal side of the arbitrary second resistor are connected to the fourth terminal and all of the n second resistors which are on the second terminal side of the arbitrary second resistor are connected to the third terminal; and values of a and b are determined as follows:

$$b=\{-1+(1+4a)^{1/2}\}/2 \text{ and } \tfrac{1}{2}<a/(1+a+b).$$

In a preferred embodiment, the other end of the third resistor is connected to the third terminal.

Further, the first terminal is an input terminal that receives an input signal to the resistor array circuit device, and the third and fourth terminals are output terminals of the resistor array circuit device.

In accordance with another aspect of the present invention, a variable gain device comprises a resistor array circuit device including (n−1) first resistors connected in series between a first terminal and a second terminal, each first resistor having a resistance value R; (n−2) connection points between the (n−1) first resistors; n second resistors, each having a resistance value aR and each having one end connected to one of the following: the first terminal, one of the (n−2) connection points, and the second terminal; one of the n second resistors being designated as an arbitrary second resistor which separates the n second resistors so that some of the n second resistors are on a first terminal side corresponding to the first terminal and the remaining ones of the n second resistors are on a second terminal side corresponding to the second terminal; a third terminal; a fourth terminal; a third resistor having one end connected to the second terminal, another end connected to one of the third and fourth terminals, and a resistance value (1+b)R; n switches for switching the connection of other ends of the n second resistors between the third and fourth terminals; a control circuit for controlling the n switches so that all of the n second resistors which are on the first terminal side of the arbitrary second resistor are connected to the fourth terminal and all of the n second resistors which are on the second terminal side of the arbitrary second resistor are connected to the third terminal; and values of a and b are determined as follows: $b=\{-1+(1+4a)^{1/2}\}/2$ and $\tfrac{1}{2}<a/(1+a+b)$; an operational amplifier having an inverted input terminal connected to the third terminal, a non-inverted input terminal connected to the fourth terminal and an output terminal; and a fourth resistor connected between the inverted input terminal of the operational amplifier and the output terminal of the operational amplifier.

The fourth terminal is connected to a ground potential, and the first terminal is an input terminal that receives an input signal to the variable gain device.

In accordance with still another aspect of the present invention, a variable gain device comprises a resistor array circuit device including (n−1) first resistors connected in series between a first terminal and a second terminal, each first resistor having a resistance value R; (n−2) connection points between the (n−1) first resistors; n second resistors, each having a resistance value aR and each having one end connected to one of the following: the first terminal, one of the (n−2) connection points, and the second terminal; one of the n second resistors being designated as an arbitrary second resistor which separates the n second resistors so that some of the n second resistors are on a first terminal side corresponding to the first terminal and the remaining ones of the n second resistors are on a second terminal side corresponding to the second terminal; a third terminal; a fourth terminal; a third resistor having one end connected to the second terminal, another end connected to one of the third and fourth terminals, and a resistance value (1+b)R; n switches for switching the connection of other ends of the n second resistors between the third and fourth terminals; a control circuit for controlling the n switches so that all of the n second resistors which are on the first terminal side of the arbitrary second resistor are connected to the fourth terminal and all of the n second resistors which are on the second terminal side of the arbitrary second resistor are connected to the third terminal; and values of a and b are determined as follows: $b=\{-1+(1+4a)^{1/2}\}/2$ and $\frac{1}{2}<a/(1+a+b)$; an operational amplifier having an inverted input terminal connected to the third terminal, a non-inverted input terminal connected to the fourth terminal and an output terminal connected to the first terminal; and a fourth resistor having one end connected to the inverted input terminal of the operational amplifier.

In this embodiment, the fourth terminal is connected to a ground potential, and the variable gain device further comprises an input terminal that receives an input signal to the variable gain device, and the fourth resistor has another end connected to the input terminal.

BRIEF DESCRIPTION OF THE DRAWINGS

FIG. 2 is an electrical circuit diagram of a second embodiment of the present invention.

DESCRIPTION OF THE PREFERRED EMBODIMENTS

Figure 1:
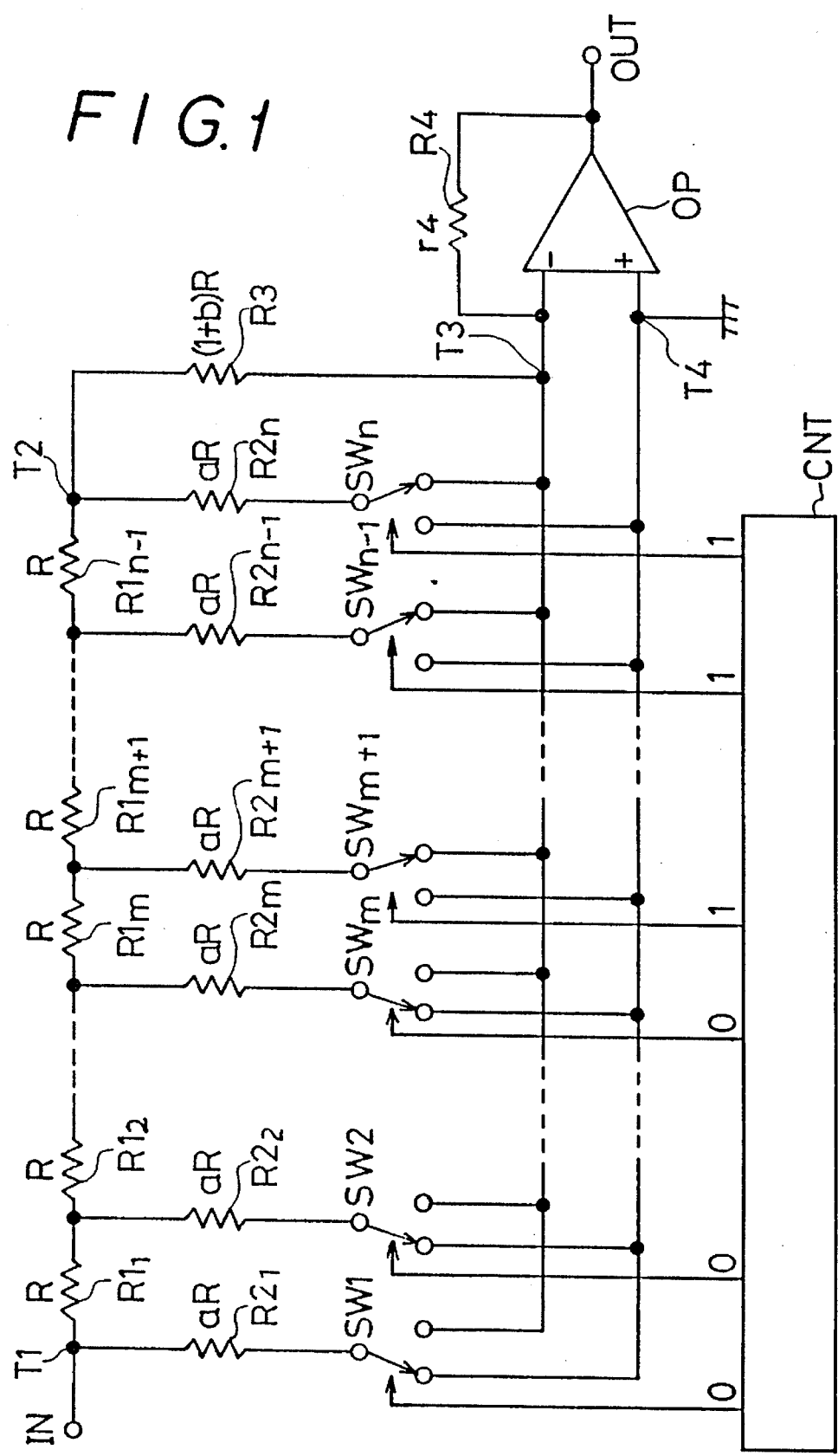
FIG. 1 is an electrical circuit diagram of a first embodiment of the present invention.
Figure 3:
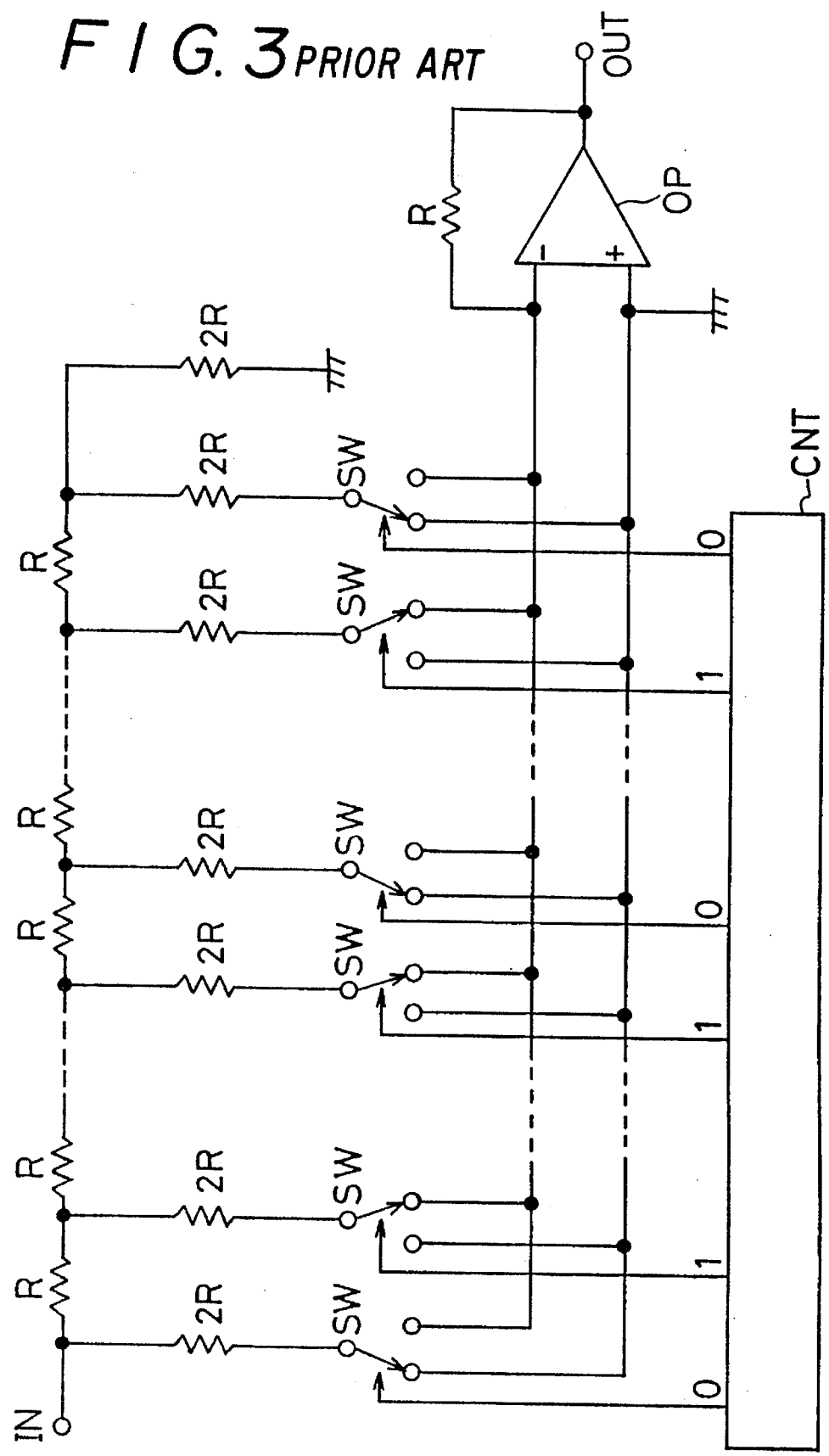
FIG. 3 is a prior art electrical circuit diagram.

A first embodiment of the invention will be described with reference to the electrical circuit diagram of FIG. 1.

(n−1) resistors $R1_1$ to $R1_{n-1}$, each having a resistance value R, are connected between a terminal T1 and a terminal T2. One end of each of n resistors $R2_1$ to $R2_n$, each having a resistance value aR, is connected to terminal T1, connection points of the (n−1) resistors $R1_1$ to $R1_{n-1}$, and terminal T2, respectively. A resistor R3 having a resistance value (1+b)R is connected between terminal T2 and a terminal T3. Switches $SW_1$ to $SW_n$, formed by transistors or the like, are connected to the other ends of the resistors $R2_1$ to $R2_n$. Connections of the other ends of ground resistors $R2_1$ to $R2_n$ are switched to terminal T3 or a ground terminal T4 by switches $SW_1$ to $SW_n$.

Switching of the switches $SW_1$ to $SW_n$ is controlled by a control signal from control circuit CNT. A so-called thermometer code is used as this control signal. This thermometer code is a code constructed with an arbitrary bit "z" as a boundary in "00...00z11...11" where "z" is "0" or "1", so that all bits on the MSB side are "0" and all bits on the LSB side are "1" with the position of "z" as a parameter. All thermometer codes from "000...000" to "111...111" can be output from the control circuit CNT. By utilizing this type of thermometer code, an arbitrary switch $SW_m$ and all switches $SW_1$ to $SW_{m+1}$ on the MSB side (terminal T1 side) of switch $SW_m$ among the switches $SW_1$ to $SW_n$ are connected to terminal T4 and all of the switches $SW_m$ to $SW_n$ on the LSB side (terminal T2 side) of switch $SW_m$ are connected to terminal T3. With this thermometer code, since all bits on which switching have been performed are switched in a single, uniform direction either from "0" to "1" or from "1" to "0", code values are modified only in one direction as a whole even in a transitional state where switching is being performed. Consequently, in a transitional state where switches $SW_1$ to $SW_n$ are being switched, even where there is a difference in the switching speeds between each of the switches, theoretically there is no generation of gridge noise.

The resistor array circuit device is formed by the above resistors $R1_1$ to $R1_{n-1}$, resistors $R2_1$ to $R2_n$, resistor R3, switches $SW_1$ to $SW_n$ and control circuit CNT.

Terminal T3 and terminal T4 of the above resistor array circuit device are respectively connected to an inverted input and a non-inverted input terminal of operational amplifier OP, and a resistor R4 having a resistance value r4, is connected between the inverted input terminal and an output terminal of operational amplifier OP.

A variable gain device is formed by the above resistor array circuit device, operational amplifier OP and resistor R4.

Next, a ladder-type resistor array formed by the resistors $R1_1$ to $R1_{n-1}$, each having a resistance value R, resistors $R2_1$ to $R2_n$, each having a resistance value aR, and resistor R3 having a resistance value (1+b)R, will be described.

The iterative impedance of the ladder-type resistor array, that is, the impedance from terminal T1 to each connection point of resistors $R1_1$ to $R1_{n-1}$ is bR. The resistance value of resistor R3 can be considered as divided into two resistances R and bR. Consequently, assuming that this iterative impedance is bR, the relationship of the constant "a" and the constant b is obtained as $$b=\{-1+(1+4a)^{1/2}\}/2 \qquad (1).$$

Also, where each stage is formed by pairs $R1_1$ and $R2_1$, $R1_2$ and $R2_2$, ... $R1_{n-1}$ and $R2_{n-1}$ of the ladder-type resistor array, the attenuation factor of each stage is a/(1+a+b). In the present variable resistor device, this attenuation factor is set such that $$\tfrac{1}{2}<a/(1+a+b) \qquad (2).$$

The value a from Equation (1) and Equation (2) is $$a>2 \qquad (3).$$

Here, a case wherein the attenuation factor is a logarithmic expression has been considered. Expressing the attenuation factors of each of the stages of the above ladder-type resistor array in dB units and expressing this as attenuation amount A, this can be expressed as $$A = -20 \log \{a/(1+a+b)\} \quad (4).$$

Where a from Equation (1) and Equation (4) is expressed as the attenuation amount A of dB units, $$a = 10^{-A/20}/(10^{-A/20} - 1)^2 \quad (5).$$

Similarly, where b is expressed as the attenuation amount A of dB units, $$b = -\tfrac{1}{2} + \{1 + 4 \cdot 10^{-A/20}/(10^{-A/20} - 1)^2\}^{1/2}/2 \quad (6).$$

Consequently, where the attenuation amount A of dB units of each stage of the ladder-type resistor array is determined, resistance value ratios of the resistors $R1_1$ to $R1_{n-1}$ each having a resistance value R, resistors $R2_1$ to $R2_n$ each having a resistance value aR, and resistor R3 having a resistance value (1+b)R can be unequivocally and precisely determined. Also, from Equation (3) and Equation (5), the attenuation amount A of dB units of each stage of the ladder-type resistor array is $$A < 20 \log 2 \text{ (approx. 6 db)} \quad (7).$$

Next, the operation of the variable gain device shown in FIG. 1 will be explained.

The analog current supplied to the input terminal IN is divided, at terminal T1, so that the (1+b)/(1+a+b) component thereof separately flows to resistor $R_{21}$ and the remaining a/(1+a+b) component thereof separately flows to resistor $R_1$. Similarly, the current supplied to each of the connection points from $R1_2$ to $R1_{n-1}$ is divided so that the (1+b)/(1+a+b) component thereof separately flows to resistors $R2_2$ to $R2_{n-1}$ and the remaining a/(1+a+b) component thereof separately flows to resistors $R1_2$ to $R1_{n-1}$. Similarly, the current supplied to terminal T2 is divided so that the (1+b)/(1+a+b) component thereof separately flows to resistor $R2_n$ and the remaining a/(1+a+b) component thereof separately flows to resistor R3. The current so separately supplied to resistors $R2_1$ to $R2_n$ flows into terminal T3 (the inverted input terminal of operational amplifier OP) or terminal T4 (normally at ground) according to the connection states of switches $SW_1$ to $SW_n$. Because switches $SW_1$ to $SW_n$ are controlled by the thermometer code from the control circuit CNT, the current supplied to switch $SW_m$ and switches $SW_1$ to $SW_{m-1}$ on the MSB side (terminal T1 side) of the switch $SW_m$ flows into terminal T4 and the current supplied to switches $SW_{m+1}$ to $SW_n$ on the LSB side (terminal T2 side) of switch $SW_m$ flows to terminal T3. Accordingly, the $\{a/(1+a+b)\}^m$ component of the current supplied to input terminal IN is supplied to terminal T3. The same current as the current supplied to terminal T3 in this manner flows to resistor R4, and the voltage drop generated by resistor R4 is lead through to output terminal The variable gain device shown in FIG. 1 is a variable attenuation device or a variable amplifier device depending on the value of resistor R4 having a resistance value r4. As can be intuitively understood from the explanation already given, in the resistor array circuit device shown in FIG. 1, the attenuation factor is smallest (attenuation factor of 1) when all of switches $SW_1$ to $SW_n$ are connected to the terminal T3 side and the attenuation factor becomes greatest (attenuation factor of $\{a/(1+a+b)\}^n$) when all of switches $SW_1$ to $SW_n$ are connected to the terminal T4 side. Consequently, assuming that the iterative impedance of the resistor array circuit device is bR, a variable attenuation device in which the highest gain is 1 or less where the resistance value r4 of resistor R4 is set to $r4 \leq bR$ can be attained, and a variable amplifier device wherein the lowest gain is 1 or more where the resistance value r4 of resistor R4 is set to $r4 \geq bR \{(1+a+b)/a\}^n$ can be attained. Of course, setting to $bR < r4 < bR \{(1+a+b)/a\}^n$ is also possible.

In the example shown in FIG. 1, as can be understood from the above, the current supplied to input terminal IN is attenuated to $a/(1+a+b)^m$ and supplied to terminal T3. This attenuation amount A can be expressed in dB units, as follows:

$$A = -20 \log \{a/(1+a+b)\}^m \quad (8).$$

Accordingly, the attenuation amount of the current supplied to terminal T3 (the inverted input terminal of operational amplifier OP) can be unequivocally and precisely set by the resistance value proportions of resistors $R1_1$ to $R1_{n-1}$ each having a resistance value R, resistors $R2_1$ to $R2_n$ each having a resistance value aR and resistor R3 having a resistance value (1+b)R. The attenuation amount of the output at output terminal OUT is also set based on Equation (8).

Also in the example shown in FIG. 1, since modification of the attenuation is performed by modification of the thermometer code, switches $SW_1$ to $SW_n$ are switched in the same direction. In other words, all the switches on which switching has been performed are switched in one direction either from the terminal 3 side to the terminal 4 side or from the terminal 4 side to the terminal 3 side. Consequently, in a transitive state wherein switches $SW_1$ to $Sw_n$ are being switched, generation of gridge noise at output terminal OUT can be suppressed.

Further, in the example shown in FIG. 1, the effect can be reduced by returning the value of a to an approximate value a' until the attenuation amount A in dB is set to be small. In other words, using Equation (1) and Equation (4) and obtaining a variation component ΔA of A with respect to the variation component Δa of a, $$dA/da = -20\{\ln 10 \times a(1+4a)^{1/2}\} \quad (9).$$

For example, in the case of A=2 dB, this is ΔA=−0.053×Δa. In other words, this is because there is no displacement other than 0.053 dB with respect to a set attenuation amount of 2 dB which is generated even where a'=a±1 is used in place of a. Consequently, high precision can be maintained even when using a value in the vicinity of a whose design conditions are good in place of a. Also, the linearity of the attenuation characteristic is not harmed even in these types of cases.

Note that in the example of FIG. 1, although the other end of resistor R3 is connected to terminal T3, the same functional and operational effect can be obtained by connecting the other end of resistor R3 to ground terminal T4.

Next, a second embodiment will be explained while referring to the electrical circuit diagram shown in FIG. 2.

As is clear from comparing FIG. 1 and FIG. 2, the structure of the resistor array circuit device is the same as the first embodiment. In the second embodiment, this resistor array circuit device is used as a feedback resistor for an operational amplifier OP. Thus, a resistor R5 having a resistance value r5 is connected to terminal T3 and a variable gain device is constructed. With regard to the functional and operational effects and the like of the variable gain device of the second embodiment, explanation will be omitted since these can be easily analogized from the explanation of the first embodiment.

The variable gain device shown in FIG. 2 is also a variable attenuation device or a variable amplifier device according to the value of resistor R5 having a resistance value r5, as in the first embodiment. In other words, in the resistor array circuit device shown in FIG. 2, the attenuation factor is smallest with an attenuation factor 1 when all of switches $SW_1$ to $SW_n$ are connected to the terminal T3 side, and the attenuation factor is greatest with an attenuation factor $\{a/(1+a+b)\}^n$ when all of switches $SW_1$ to $SW_n$ are connected to the terminal T4 side. Accordingly, assuming that the iterative impedance of the resistor array circuit device is bR, a variable amplifier device whose lowest gain is 1 or more where the resistance r5 of resistor R5 is set to $r5 \leq bR$ can be obtained, and a variable attenuation device whose highest gain is 1 or less where the resistance value r5 of resistor R5 is set to $r5 \geq bR\{(1+a+b)/a\}^n$ can be obtained. Of course, a setting of $bR < r5 < bR\{(1+a+b)/a\}^n$ is possible where necessary.

Note that in the embodiment shown in FIG. 2, although the other end of resistor R3 is connected to terminal T3, the same function and operational effect can be obtained where the other end of resistor R3 is connected to ground terminal T4.

According to the resistor array circuit device and variable gain device according to the present invention, it is possible to prevent generation of gridge noise, as well as precisely setting attenuation factors and the like.

Having described specific preferred embodiments of the invention with reference to the accompanying drawings, it will be appreciated that the present invention is not limited to those precise embodiments and that various changes and modifications can be effected by one skilled in the art without departing from the scope and spirit of the invention as claimed.

What is claimed is:

1. A resistor array circuit device comprising:

(n–1) first resistors connected in series between a first terminal and a second terminal, each first resistor having a resistance value R;

(n–2) connection points between the (n–1) first resistors;

n second resistors, each having a resistance value aR and each having one end connected to one of the following:
   the first terminal,
   one of the (n–2) connection points, and
   the second terminal;

one of said n second resistors being designated as an arbitrary second resistor which separates said n second resistors so that some of said n second resistors are on a first terminal side corresponding to said first terminal and the remaining ones of said n second resistors are on a second terminal side corresponding to said second terminal;

a third terminal;
   a fourth terminal;

a third resistor having one end connected to the second terminal, another end connected to one of the third and fourth terminals, and a resistance value (1+b)R;

n switches for switching the connection of other ends of the n second resistors between the third and fourth terminals;

a control circuit for controlling the n switches so that all of the n second resistors which are on the first terminal side of said arbitrary second resistor are connected to the fourth terminal and all of the n second resistors which are on the second terminal side of said arbitrary second resistor are connected to the third terminal; and values of a and b are determined as follows:

$b=\{-1+(1+4a)^{1/2}\}/2$ and $\frac{1}{2} < a/(1+a+b)$.

2. A resistor array circuit device according to claim 1, wherein said another end of said third resistor is connected to said third terminal.

3. A resistor array circuit device according to claim 1, wherein said first terminal is an input terminal that receives an input signal to said resistor array circuit device, and said third and fourth terminals are output terminals of said resistor array circuit device.

4. A variable gain device comprising:

a resistor array circuit device including:
   (n–1) first resistors connected in series between a first terminal and a second terminal, each first resistor having a resistance value R;

(n–2) connection points between the (n–1) first resistors;

n second resistors, each having a resistance value aR and each having one end connected to one of the following:
   the first terminal,
   one of the (n–2) connection points, and
   the second terminal;

one of said n second resistors being designated as an arbitrary second resistor which separates said n second resistors so that some of said n second resistors are on a first terminal side corresponding to said first terminal and the remaining ones of said n second resistors are on a second terminal side corresponding to said second terminal;

a third terminal;
   a fourth terminal;

a third resistor having one end connected to the second terminal, another end connected to one of the third and fourth terminals, and a resistance value (1+b)R;

n switches for switching the connection of other ends of the n second resistors between the third and fourth terminals;

a control circuit for controlling the n switches so that all of the n second resistors which are on the first terminal side of said arbitrary second resistor are connected to the fourth terminal and all of the n second resistors which are on the second terminal side of said arbitrary second resistor are connected to the third terminal; and values of a and b are determined as follows:

$b=\{-1+(1+4a)^{1/2}\}/2$ and $\frac{1}{2} < a/(1+a+b)$;

an operational amplifier having an inverted input terminal connected to the third terminal, a non-inverted input terminal connected to the fourth terminal and an output terminal; and a fourth resistor connected between the inverted input terminal of the operational amplifier and the output terminal of the operational amplifier.

5. A variable gain device according to claim 4, wherein said another end of said third resistor is connected to said third terminal.

6. A variable gain device according to claim 4, wherein said fourth terminal is connected to a ground potential.

7. A variable gain according to claim 4, wherein said first terminal is an input terminal that receives an input signal to said variable gain device.

8. A variable gain device comprising:

a resistor array circuit device including:
   (n–1) first resistors connected in series between a first terminal and a second terminal, each first resistor having a resistance value R;

(n–2) connection points between the (n–1) first resistors;

n second resistors, each having a resistance value aR and each having one end connected to one of the following:
the first terminal,
one of the (n–2) connection points, and
the second terminal;

one of said n second resistors being designated as an arbitrary second resistor which separates said n second resistors so that some of said n second resistors are on a first terminal side corresponding to said first terminal and the remaining ones of said n second resistors are on a second terminal side corresponding to said second terminal;

a third terminal;

a fourth terminal;

a third resistor having one end connected to the second terminal, another end connected to one of the third and fourth terminals, and a resistance value $(1+b)R$;

n switches for switching the connection of other ends of the n second resistors between the third and fourth terminals;

a control circuit for controlling the n switches so that all of the n second resistors which are on the first terminal side of said arbitrary second resistor are connected to the fourth terminal and all of the n second resistors which are on the second terminal side of said arbitrary second resistor are connected to the third terminal; and values of a and b are determined as follows:

$$b=\{-1+(1+4a)^{1/2}\}/2 \text{ and } \tfrac{1}{2}<a/(1+a+b);$$

an operational amplifier having an inverted input terminal connected to the third terminal, a non-inverted input terminal connected to the fourth terminal and an output terminal connected to the first terminal; and a fourth resistor having one end connected to the inverted input terminal of the operational amplifier.

9. A variable gain device according to claim 8, wherein said another end of said third resistor is connected to said third terminal.

10. A variable gain device according to claim 8, wherein said fourth terminal is connected to a ground potential.

11. A variable gain device according to claim 8, further comprising an input terminal that receives an input signal to said variable gain device, and said fourth resistor has another end connected to said input terminal.

* * * * *